(12) United States Patent
Cheng et al.

(10) Patent No.: US 8,372,742 B2
(45) Date of Patent: Feb. 12, 2013

(54) METHOD, SYSTEM, AND APPARATUS FOR ADJUSTING LOCAL AND GLOBAL PATTERN DENSITY OF AN INTEGRATED CIRCUIT DESIGN

(75) Inventors: Ying-Chou Cheng, Zhubei (TW); Cheng-Lung Stanley Tsai, Hsin-Chu (TW); Tsong-Hua Ou, Taipei (TW); Cheng Kun Tsai, Hsinchu (TW); Ru-Gun Liu, Hsinchu (TW); Wen-Chun Huang, Xi-Gang Xiang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 477 days.

(21) Appl. No.: 12/712,665

(22) Filed: Feb. 25, 2010

(65) Prior Publication Data
US 2011/0204470 A1 Aug. 25, 2011

(51) Int. Cl.
*H01L 21/82* (2006.01)

(52) U.S. Cl. .................. 438/622; 438/128; 438/689

(58) Field of Classification Search .................. 438/128, 438/622–650, 689–693, E21.526; 716/118, 716/119, 139, 126
See application file for complete search history.

(56) References Cited

U.S. PATENT DOCUMENTS

| | | | | |
|---|---|---|---|---|
| 8,139,843 B2 * | 3/2012 | Kulkarni et al. | ............. | 382/144 |
| 8,185,862 B2 * | 5/2012 | Durbha et al. | ................ | 716/133 |
| 8,187,924 B2 * | 5/2012 | Nakajima et al. | ............. | 438/128 |
| 8,227,892 B2 * | 7/2012 | Chang | ........................... | 438/381 |

\* cited by examiner

*Primary Examiner* — Cuong Q Nguyen
(74) *Attorney, Agent, or Firm* — Haynes and Boone, LLP

(57) ABSTRACT

An integrated circuit (IC) design method providing a circuit design layout having a plurality of functional blocks disposed a distance away from each other; identifying a local pattern density to an approximate dummy region, on the circuit design layout, within a predefined distance to one of the functional blocks; performing a local dummy insertion to the approximate dummy region according to the local pattern density; repeating the identifying and performing to at least some other of the functional blocks; and implementing a global dummy insertion to a non-local dummy region according to a global pattern density.

18 Claims, 5 Drawing Sheets

METHOD, SYSTEM, AND APPARATUS FOR ADJUSTING LOCAL AND GLOBAL PATTERN DENSITY OF AN INTEGRATED CIRCUIT DESIGN

BACKGROUND

This disclosure relates in general to integrated circuit (IC) design, and more particularly, to adjusting local and global pattern density of an IC design.

In conventional IC design manufacturing technologies, pattern density variation may lead to design issues. For example, RC-parasitics variation may result from non-uniformity with respect to IC pattern thickness. Furthermore, RTA and thermal variability may be negatively affected by pattern density non-uniformity.

Thus, there is a need for a method, system, and apparatus for adjusting local and global pattern density of an IC design during various IC manufacturing processes.

SUMMARY

The present disclosure provides a method, system, and apparatus for adjusting local and global pattern density of an integrated circuit design. One embodiment involves an integrated circuit (IC) design method that includes providing a circuit design layout having a plurality of functional blocks disposed a distance away from each other; identifying a local pattern density to an approximate dummy region, on the circuit design layout, within a predefined distance to one of the functional blocks; performing a local dummy insertion to the approximate dummy region according to the local pattern density; repeating the identifying and performing to at least some other of the functional blocks; and implementing a global dummy insertion to a non-local dummy region according to a global pattern density.

According to another embodiment, A computer-implemented integrated circuit (IC) design method includes providing a circuit design layout having a plurality of functional blocks; implementing a first dummy insertion to each of the functional blocks; implementing a second dummy insertion to the circuit design layout according to a global pattern density; identifying a local pattern density to an approximate dummy region on the circuit design layout and adjacent one of the functional blocks; and implementing a third dummy insertion to the approximate dummy region according to the local pattern density.

According to yet another embodiment, an integrated circuit (IC) includes a plurality of functional blocks one substrate, one of the functional block has a particular pattern density P1; an approximate dummy region within a predefined distance to the one of the functional blocks; and a non-local dummy region away from any of the plurality of functional blocks beyond the predefined distance, the non-local dummy region having a global pattern density P2, wherein the approximate region has a graded pattern density varying from P1 to P2.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to integrated circuit design, and more particularly, to adjusting local and global pattern density of an integrated circuit design. It is understood, however, that specific embodiments are provided as examples to teach the broader inventive concept, and one of ordinary skill in the art can easily apply the teaching of the present disclosure to other methods or apparatus. Also, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings.

Design for manufacturability, or DFM, is an integration of manufacturing data and design procedure for better yield and design efficiency. An interaction and communication between designer and manufacturer is enhanced thereby for more accurate, faster, and more efficient design. In one example, various manufacturing data are formulated, quantified, and integrated to enable collaboration between manufacturer and designer, reduce design time and design cost, and increase manufacturing yield and production performance. DFM can be realized at various design stages with collaboration of design tool vendors. The manufacturer may be a semiconductor foundry. The designer may be an integrated circuit (IC) design house. The design tool vendor may be an electronic design automation (EDA) tool vendor. In some examples, a single company may include all three.

Figure 1:
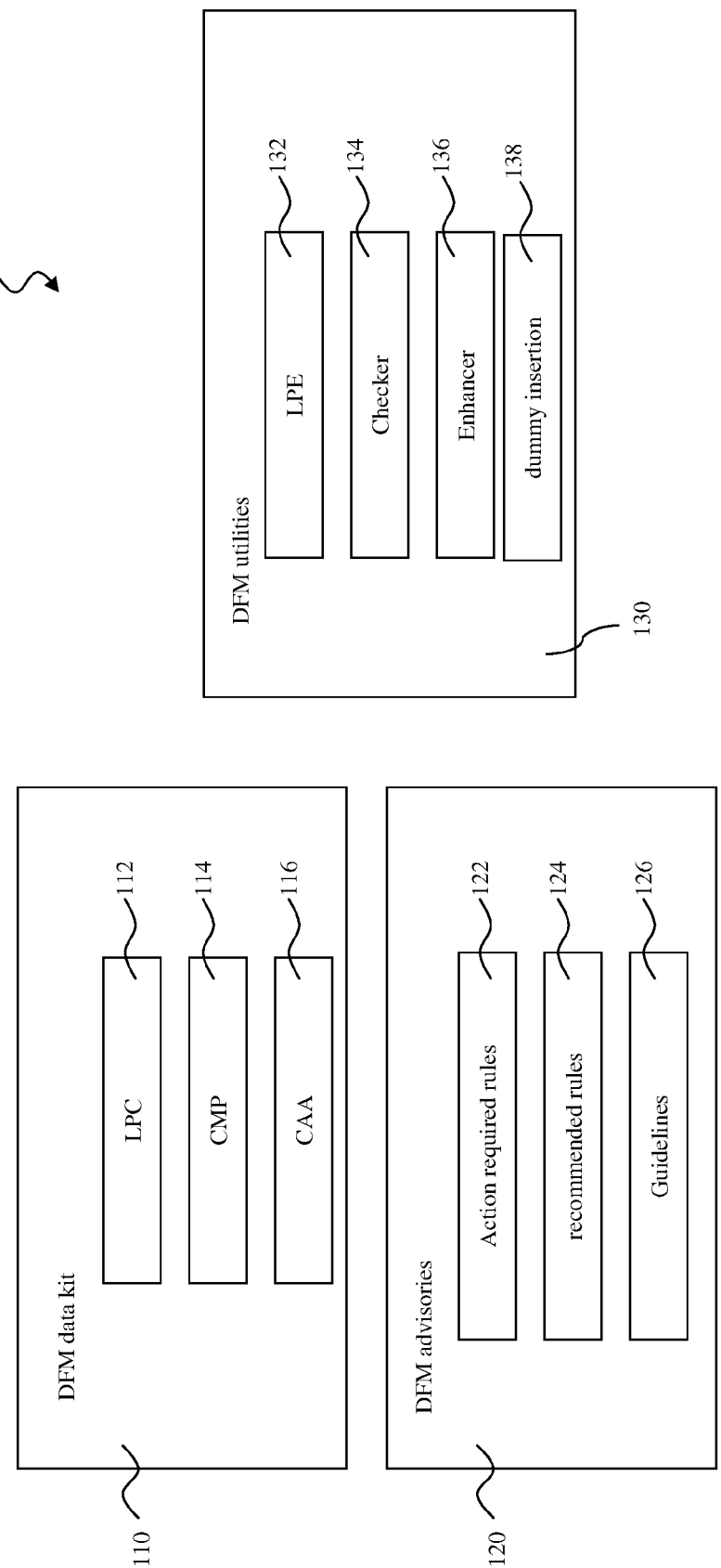
FIG. 1 is a block diagram illustrating one embodiment of a design for manufacturing (DFM) system constructed according to aspects of the present disclosure.

Referring to FIG. 1, an embodiment of a DFM tool kit 100 in a block diagram may include one or more various modules. In the present embodiment, the DFM tool kit 100 includes a DFM data kit (DDK) 110. Manufacturing data, such as processing recipes, tool characterization, manufacturing environment, production and processing statistical information, and IC testing and measurement data, are compiled, accumulated, and formulated to form the DDK and provide a manufacturing simulation such as lithography process check (LPC) simulation 112, chemical mechanical polishing (CMP) simulation 114, and/or critical area analysis (CAA) simulation 116. In LPC simulation 112, a lithography process can be simulated for a design layout by implementing DDK. Various failure areas, defect areas, or weak areas associated with the manufacturing process, referred to as hotspots, can be identified for further design tuning.

In the CMP simulation 114, a CMP process is simulated to a design layout by utilizing DDK 110. The design layout is converted to a material thickness and thickness hotspots can be identified for further design tweaking and tuning. CAA simulation 116 utilizes DDK for critical area identification and design improvement. DFM data may be packed in a unified format, referred to as DFM unified format (DUF). DDK 110 can be provided to an IC design vendor and be integrated into a design tool, or directly distributed to a designer such as a fab-less design house and employed by the designer in a design tool.

DFM tool kit 100 also includes DFM advisories 120. The DFM advisories 120 are extracted from the manufacturing information and provided for an IC design tool and/or a designer. The DFM advisories 120 further include DFM rules that can be incorporated into a design tool for checking any violation. DFM rules such as action required rules 122 are binding, requiring further actions to eliminate the associated violation. Recommended rules 124 are not binding and suggested for design improvement. The DFM advisories also include guidelines 146, provided for the designer to follow in implementing an IC design procedure.

DFM tool kit 100 also includes DFM utilities 130, utilizing DDK 110 and DFM advisories 120 in IC design. DFM utilities 130 may be integrated into a design tool and incorporated into a design flow. For example, dummy insertion may be implemented at the place-and-route design stage so that dummy features are automatically generated in the IC layout to reduce CMP manufacturing variances. DFM utilities 130 may provide corrective actions and solutions to the designer to guide for design improvement and tuning. For example, DFM utilities 130 may provide a solution to eliminate identified hotspots from a lithography process simulation, such as reconfiguring metal lines to eliminate the hotspots. In one embodiment, DFM utilities 130 include a layout parasitic extraction (LPE) deck 132 for extracting more accurate parasitic parameters such as parasitic resistance and capacitance with the manufacturing data such as CMP data, and further for providing suggested actions to adjust parasitic parameters and timing. DFM utilities 130 may also include a checker 134 that is integrated with DFM rules, is able to automatically check the layout for any DFM rule violation, and/or provides suggestions to eliminate the violation. DFM utilities 130 may include an enhancer 136 that is capable of automatically adjusting the layout to meet the DFM rules or eliminate identified hotspots. DFM utilities 130 may further include a dummy insertion module 138 to incorporate dummies (e.g., non-conducting metal features) into a design layout to eliminate CMP process variation.

DFM tool kit 100 provides model-based utilities from various simulations and rule-based utilities from DFM advisories. DFM tool kit 100 can be implemented at various designing stages and certain manufacturing stages. For example, dummy insertion may be implemented at place-and-route step such that the dummy features are included in a layout at early design stage. LPE deck may be implemented at extraction and a timing simulation. LPC may be implemented before the tape-out. Alternatively, LPC may be implemented after the tape-out. In this situation, the layout can be adjusted to eliminate hotspots identified by LPC before fabricating a mask of the layout in a mask shop.

Figure 2:
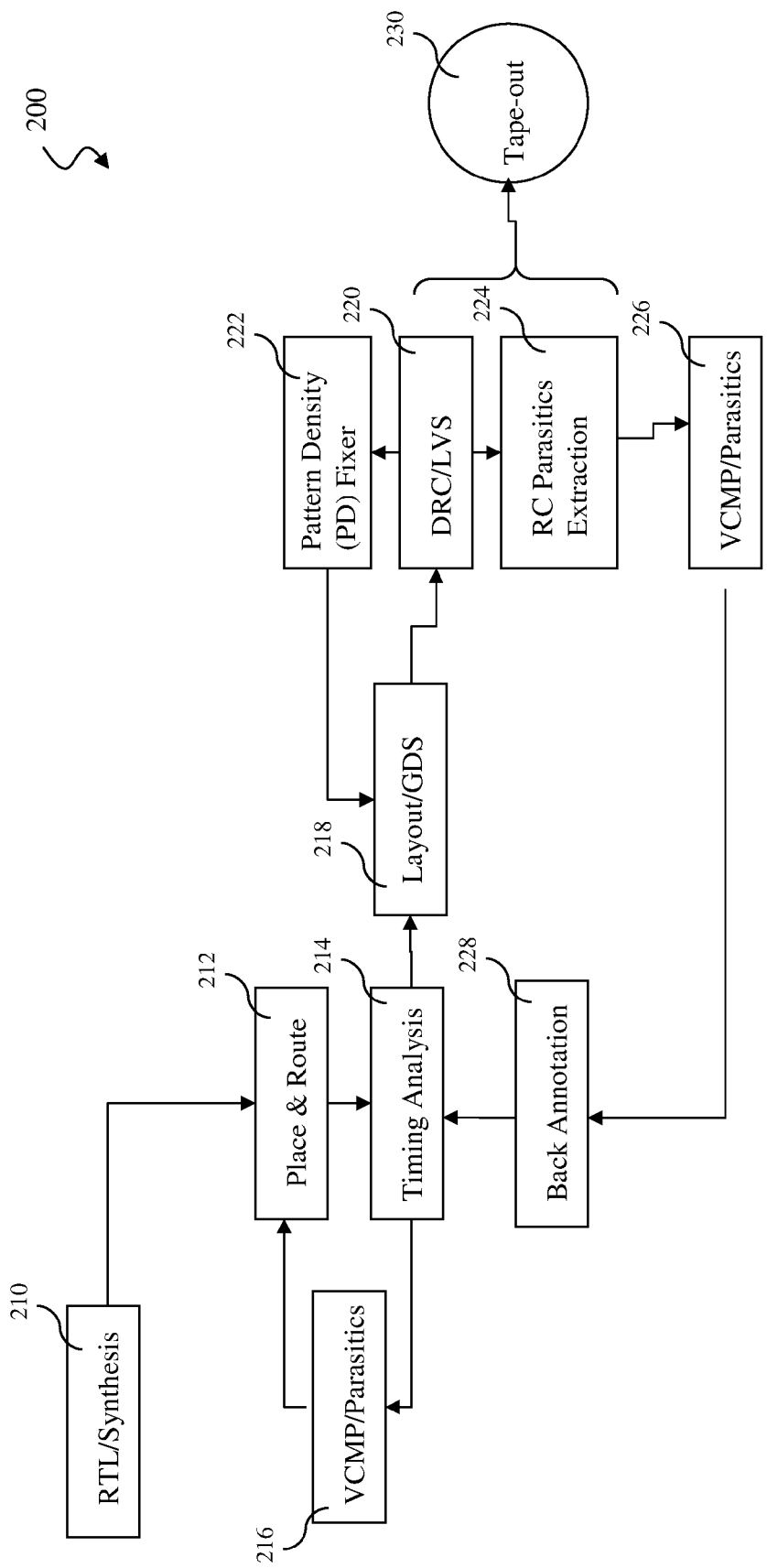
FIG. 2 is a flowchart of one embodiment of an integrated circuit (IC) design method constructed according to aspects of the present disclosure.

FIG. 2 is a flowchart of an IC design flow (or design method) 200 utilizing a virtual CMP (VCMP) and resistance and capacitance (RC) extraction integrated and incorporated into various steps thereof, with various functions and mechanism. A design system to implement the method 200 is described collectively. The VCMP and RC extraction are integrated to guide IC design and avoid CMP related layout issues.

The VCMP includes a CMP process simulator. The CMP simulator adopts a model to describe a CMP process and further includes the CMP manufacturing data to simulate a real manufacturing CMP process. The CMP manufacturing data may include CMP tool characterization data, CMP slurry and other chemicals characterization data, and CMP processing recipes. Design layout parameters are extracted from a layout such as a design layout presented in a GDS format and then provided for a CMP simulation to the layout. Further procedure may include RC extraction and timing simulation.

The IC design method 200 includes a front-end design flow before the physical layout design, such as a register-transfer level (RTL) design module 210. After the logic functionality is defined, the design flow proceeds to the back-end portion, which includes those design steps described below.

The design method 200 includes a place-and-route module 212. Standard cells, input/output (I/O) cells, and IP/Macro can be placed in various locations according to the functional connectivity and the optimization of signal routing. A physical layout is created at this stage.

The design method also includes a timing simulation module 214. After placement and routing are accomplished at step 212, a simplified RC extraction of the interconnection is performed for signal timing simulation. Routing and cell placement can be further optimized to improve signal timing.

An integrated virtual CMP (VCMP) and parasitic extraction module 216 is incorporated into the design flow from the timing analysis module 214 and the place and route module 212. A virtual CMP is integrated with RC parasitic extraction and enhance the back annotation to achieve precise estimation of wire thickness/resistance and derives better signal timing expectation. A quick evaluation of the CMP effect is therefore embedded in the timing closure flow to narrow down the gap between the first timing expectation and layout back-annotation. A loop including the timing simulation 214, VCMP/parasitic 216, and physical layout modification at the place and route 212 will continue until the signal timing is optimized to be within the expected specification. The VCMP 216 is invoked by the simplified RC extractor at step 214 to include the process influence of CMP to the resistance/thickness of the interconnection. Traditional RC extraction considers only ideal and constant thickness for the ideal RC extraction. VCMP embedded flow can introduce the silicon reality and eliminate the gap between the design expectation and silicon result. Alternatively, the loop may only include the place and route 212 and VCMP/Parasitic 216 to eliminate a simplified RC extraction of the interconnection. In another embodiment, the design method 200 may move from the place and route 212 to VCMP/parasitic 216 for simulated metal/dielectric thicknesses and parasitic RC parameters, and then moves to the timing analysis 214 for only timing evaluation based on the simulated CMP results.

The design method 200 also include layout/GDS module 218. After optimized placement and routing, the physical layout is created (in GDS format in one example) and finalized for further layout enhancement and sign-off verification. The design method 200 also includes design rule check (DRC) and layout vs. schematic (LVS) module 220. DRC is performed on the physical layout to verify that the manufacturer concerned process requirements have been satisfied. LVS is performed such that the devices/interconnects are extracted to generate a netlist for comparison with an original design netlist defined at step 210. This step is referred to as sign-off verification as well.

A PD fixing module 222 is applied to the layout for maintaining a uniform pattern density across various portions of the IC design. The PD fixing module 222 may be used to tune the local pattern density around a functional block of the IC design as well as the global pattern density of the IC design. The process result from the step 222 will be feedback to step 218 to further tune the design layout. The PD fixing module 222 can be implemented by a PD fixer module integrated with the DFM utilities 130 of FIG. 1.

The design method 200 also includes a RC parasitic extraction module 224. Electrical parameter extraction of the physical layout is performed after the sign-off verification 220 has been accomplished. Parasitic resistance and capacitance of the interconnection and the devices are extracted based on VCMP to reflect real electric signal timing.

The design method 200 includes another integrated VCMP and parasitic extraction module 226, precisely predicting the CMP process effect in advance at the design stage, and to make the silicon results close to the design specification. Alternatively, the VCMP/Parasitic module 226 and 216 may share a common VCMP/Parasitic module for each intended purpose, partially share some functional sub-module, or mutual support each other. In another embodiment, a VCMP simulator is integrated with the RC parasitic extraction 224 to consider the influence of the CMP process induced interconnect thickness/resistance change.

More precise time simulations can be achieved in a back annotation module 228. With regards to the VCMP in step 226, the simulation results will have less gap or difference, as compared to the silicon behavior. The electrical parameters of the interconnect and device are back-annotated into the timing analysis of step 214 again to determine if further signal timing deviation appear according to the layout and the parasitic effect. The layout will be further tuned if the signal timing is out of specification.

The design method 200 proceeds to tape-out at step 230. After all the verifications of design functional specification, signal timing, device connectivity, and design rule of layout are accomplished, the layout will taped out and be provided to a manufacturer, such as a semiconductor foundry for fabrication.

Figure 3:
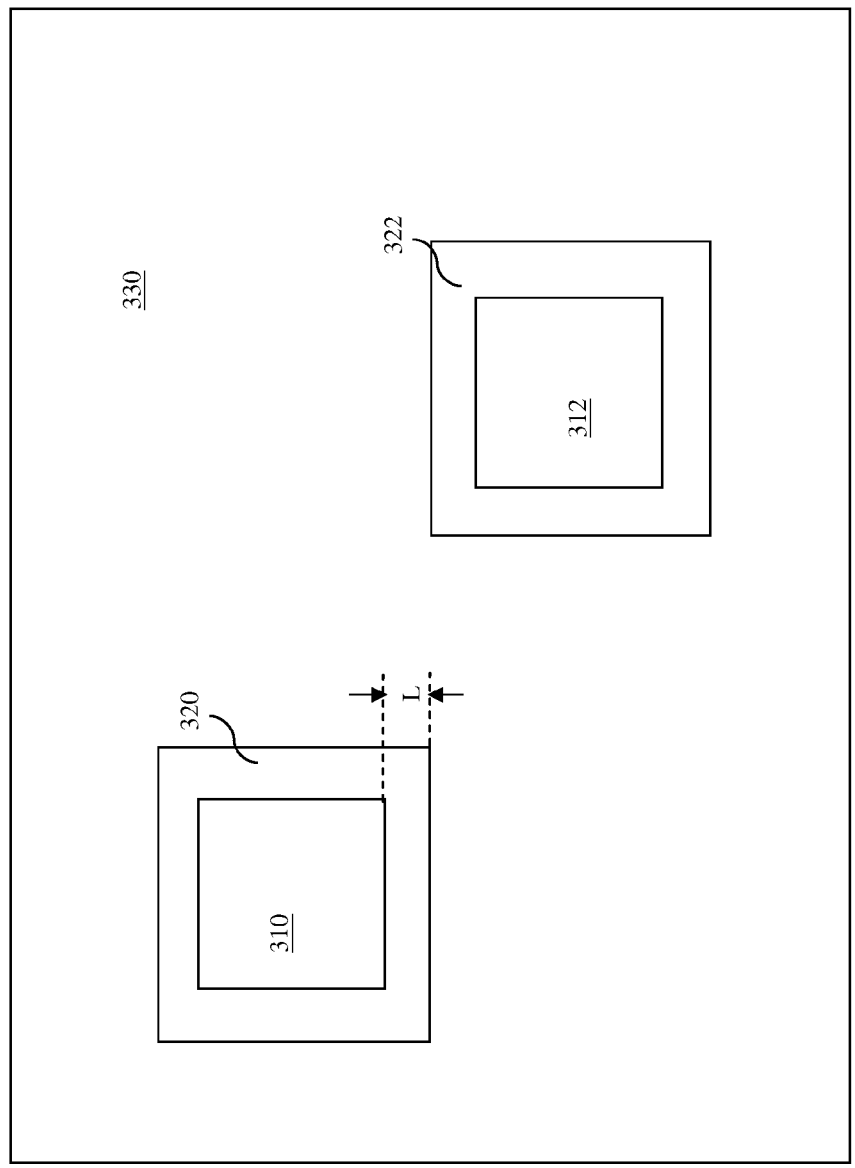
FIG. 3 is a diagrammatic drawing illustrating a circuit design system according to aspects of the present disclosure.

Referring to FIG. 3, shown therein is a portion of an embodiment of an IC design (layout) 300 of a physical IC according to an embodiment of the present disclosure. The IC design 300 includes a plurality of functional blocks, such as exemplary functional blocks 310 and 312 spaced from each other. Only two functional blocks 310/312 of the IC design 300 is shown in FIG. 3 for clarity. In various embodiments, each functional block can be any proper functional circuit and in any geometry and dimensions.

For one functional block such as the functional block 310, an approximate region (or an approximate dummy region or a local region) 320 is defined to include dummy areas within a certain dimension "L" to the functional block. Specifically, the approximate region 320 is surrounding the functional block 310 and is within the certain dimension L of the perimeter of the functional block 310. In one embodiment, the certain dimension L is predefined according to the characteristic of the circuit in the functional block. In another embodiment, the certain dimension L is defined according to the characteristic of a chemical mechanic polishing (CMP) process. In such a case, the CMP process is relevant as it is to be applied to a semiconductor substrate having a pattern of the IC design 300. In one embodiment, the certain dimension ranges between about 20 micron and about 40 micron, depending on the technology node. In the present embodiment, the certain dimension is defined as about 20 micron. In other embodiments, the approximate region 320 may have any geometry associated with the geometry of the corresponding functional block 310. In other embodiments, the approximate region 320 may be any size and is within any predetermined distance of the perimeter of the functional block 310. Furthermore, in other embodiments, the approximate region 320 surrounding the functional block 310 may be any shape. An approximate region 322 defined to the other functional blocks 312 of the IC design 300 may be similar to the approximate region 320 of the functional block 310.

Outside of the approximate regions (such as 320 and 322) there is a non-local dummy region 330. The non-local dummy region 330 includes any dummy areas of the IC design 300 that is outside of the approximate regions (including 320 and 322). However, the non-local dummy region 330 does not include the other functional blocks 310 not shown in FIG. 3 and the respective approximate regions (such as 320 and 322 that surround such functional blocks 310 and 312, respectively).

In one embodiment, the non-local dummy region 330 includes a plurality of non-local dummy portions separated by various functional blocks and approximate regions. Each of the non-local dummy portions may be scattered and separated from other non-local dummy portions. In various embodiments, each of the non-local dummy portions may be any shape, including, without limitation, square, rectangular, or circular. In other embodiments, the non-local dummy portions may be any size.

In the IC design 300, the functional blocks (such as 310 and 312), the local regions (such as 320 and 322), and the non-local dummy region 330 have various different pattern densities. In another embodiment, the functional block 310 and the local region 312 have different pattern densities. Our experiments and studies led us to a conclusion that the pattern density of a approximate region is a critical parameter to the corresponding functional block when considering the corresponding functional block's electrical performance. Lithographic stress-volume and well-proximity may be negatively affected by pattern density variation. Local pattern density around a critical circuit block in an IC design is a key index, especially with respect to electrical performance and process uniformity. As discussed with respect to FIG. 4 below, the pattern density (PD) fixer 222 shown in FIG. 2 may be used to tune the IC design 300 to facilitate a uniform pattern density between the approximate region 320 and the corresponding functional block 310 and, and further facilitate a global uniform pattern density utilizing the non-local dummy region 330.

Figure 4:
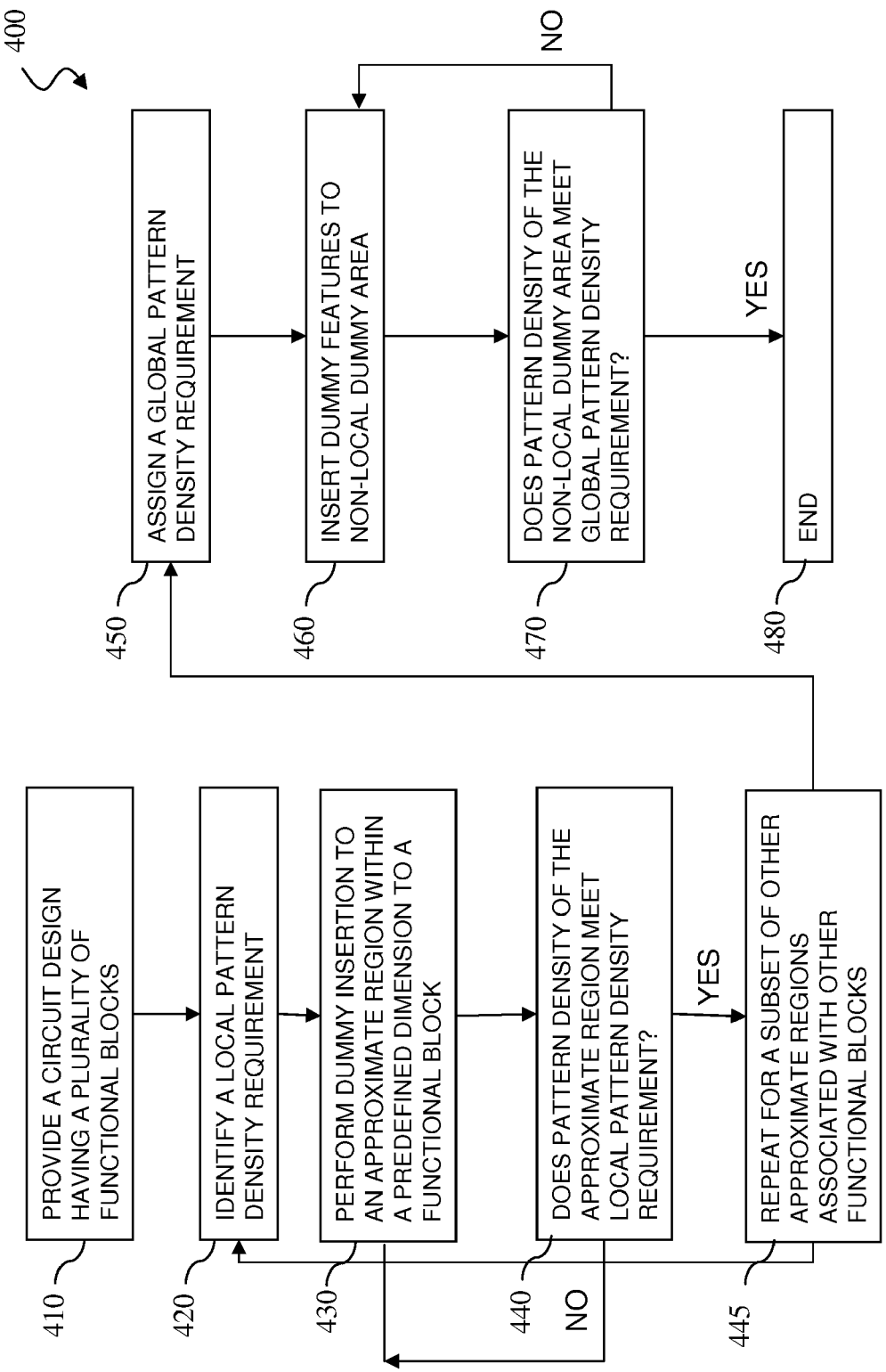
FIG. 4 is a flowchart of another embodiment of an integrated circuit (IC) design method constructed according to aspects of the present disclosure.

Referring to FIG. 4, with continued reference to FIGS. 2 and 3, shown therein is an embodiment of a method 400 implemented by the PD fixer 222. Method 400 includes a method block 410 that includes providing a circuit design 300 having a plurality of functional blocks disposed a distance away from each other. The IC design 300 may be either an actual IC design or a simulated GDS pattern.

At the method block 410, a dummy insertion process may be applied to each functional block such that each functional block has a uniform pattern density. The dummy insertion process at the method block 410 may include multiple sub-steps, each sub-step is applied to each functional block such that the pattern density of the targeted functional block is substantially uniformed, the fabrication processes (such as CMP process) and the device electrical performance are uniformed accordingly. The dummy insertion process to the functional blocks can be implemented by an integrated circuit (IC) designer (such as a design house) or an IC manufacturer (such as a semiconductor foundry).

At method block 420 a local pattern density requirement for a chosen functional block (such as functional block 310) is identified. The local pattern density requirement is determined based on the pattern density of the corresponding functional block. In one embodiment, the local pattern density requirement is determined based on a calculation of an average pattern density of the chosen functional block. In other embodiments, the local pattern density requirement may be a predetermined value that is based on manufacturer data (such as CMP data) and is provided by a user, such as an engineer. In yet another embodiment, the local pattern density requirement may be determined using both the average pattern density of the chosen functional block and user input.

Method block 430 includes performing a dummy insertion process to various approximate regions. The dummy insertion process at the method block 430 is applied to each approximate region according to the local pattern density requirement of a corresponding functional block. For example, the dummy insertion process is applied to the approximate region 320 according to the local pattern density requirement of the chosen functional block 310. For another example, the dummy insertion process is applied to the approximate region 322 according to the local pattern density requirement of the chosen functional block 312. A goal of dummy insertion at method block 430 is achieving the local pattern density requirement identified in method block 420 such that the pattern density of the chosen approximate region meets the local pattern density requirement. Thus the processing uniformity and the electrical performances of the functional blocks are enhanced.

Dummy insertion at method block 430 adds dummy features to the chosen approximate region. In another embodiment, the dummy insertion at method block 430 is an iterative process that further includes resizing the added dummy features, and repositioning the added dummy features. The foregoing processes are repeated until the chosen approximate region (such as 320) has a pattern density that either meets the local pattern density requirement, or comes within an acceptable margin of the local pattern density requirement. Dummy insertion at method block 430 also includes performing at least one of the following iterative processes until each approximate region has a pattern density that either meets the local pattern density requirement, or comes within an acceptable margin of the local pattern density requirement: choosing an approximate region (such as 320 or 322), adding dummy features to the chosen approximate region, resizing the added dummy features, and repositioning the added dummy features.

Upon performing the dummy insertion at method block 430, the method 400 proceeds to method block 440, which includes determining whether the new pattern densities of the chosen approximate region meet the local pattern density requirement. If the new pattern densities meet the local pattern density, then the method 400 proceeds to method block 445. Otherwise, the method 400 returns to method block 420, and method blocks 420, 430 and 440 are repeated. At method block 445, method blocks 430 and 440 are repeated for a subset of functional blocks and the respective approximate regions that are within a predefined dimension to the corresponding functional blocks. In one embodiment, the subset of functional blocks includes all critical functional blocks of the IC design 300. In another embodiment, the subset of functional blocks includes all functional blocks of the IC design 300. In yet another embodiment, the subset of functional blocks includes any group of the functional blocks of the IC design layout 300.

After repeating blocks 420, 430 and 440, the method 400 proceeds to method block 450, which includes assigning a global pattern density requirement, and then proceeding to block 460. Generally, the global pattern density requirement is different from various local pattern density requirements. In one embodiment, the global pattern density requirement is determined based on the pattern densities of the various functional blocks. For example, the global pattern density requirement is an median pattern density among the pattern densities of various functional blocks. In another embodiment, the global pattern density requirement is determined based on an average on the pattern densities of various functional blocks. For example, if the pattern density of a "i" functional block is Pi and the total number of the functional blocks is n, then the global pattern density requirement equals to sum (Pi)/n. In another embodiment, the global pattern density requirement is determined based on a weighted average on the pattern densities of various functional blocks. For example, if the pattern density of an "i" functional block is Pi, the area of the "i" functional block is Si, and the total number of the functional blocks is n, then the global pattern density requirement equals to a weighted average expressed as sum (Pi*Si)/sum (Si). In another embodiment, the global pattern density requirement is determined based on the manufacturing data, such as CMP process characteristic data.

At method block 460, dummy features are inserted to non-local dummy area 330. Dummy feature insertion at method block 460 is an iterative process that includes at least one of the following: adding dummy features to the non-local dummy area, resizing the dummy features, and repositioning the dummy features until the overall pattern density within the functional blocks, the approximate regions (local areas), and the non-local dummy area either approaches the global pattern density requirement or comes within an acceptable margin of the global pattern density requirement. The non-local dummy area 330 may be divided into a plurality of non-local portions. The foregoing adding, resizing, and repositioning can be repeated for each of the non-local portions.

Finally, method block 470 includes determining whether the non-local dummy area 330 meets the global pattern density requirement. More particularly, the overall pattern density of an area that includes the functional blocks, the approximate regions (local areas), and the non-local dummy area 330 approaches an uniform pattern density distribution. If the non-local dummy area meets the global pattern density requirement, then the method 400 ends at method block 480. Otherwise, the method returns to method block 460, and method blocks 460 and 470 are repeated until the global pattern density requirement is satisfied.

The method 400 shown in FIG. 4 may be implemented by an IC designer prior to sending the IC design to a manufacturer. In other embodiments, the method 400 may be implemented by a manufacturer after receiving the IC design from a designer. The improved IC design is then transferred to a photomask. The photomask is further used for making integrated circuits on semiconductor wafers.

Although embodiments of the present disclosure have been described in detail, those skilled in the art should understand that they may make various changes, substitutions and alterations herein without departing from the spirit and scope of the present disclosure. In one embodiment, the dummy insertion applied at method block 430 to the approximate region to a corresponding functional block is adjusted to achieve a graded pattern density in one or more approximate regions. In one example, dummy insertion is applied to an approximate region such that the pattern density of the approximate region continuously varied from the pattern density of the associated functional block at its edge adjacent the associated functional block to the global pattern density of the non-local dummy area 330 at its another edge adjacent the non-local dummy area. In furtherance of the example, the graded pattern density of the approximate region has a lowest pattern density PD1, highest pattern density PD2 and its relative difference (PD1−PD2)/PD1 equals to or is less than about 2%. In another example, two functional blocks have an overlapping approximate region therebetween. If a first functional block has a pattern density P1 and the second functional block has a pattern density P2, then the overlapping approximate region has a graded pattern density from P1 at a portion adjacent the first functional block to P2 at another portion adjacent the second functional block.

In another embodiment, the non-local dummy region may include other non-critical circuit or devices. In another embodiment, each functional block and the associated approximate region are collectively filled with dummy features during one dummy insertion process according to a local pattern density requirement. In another embodiment, the method 400 may have difference sequences. For example, prior to identifying any approximate region, a global dummy insertion process, similar to steps 450, 460 and 470 of the method 400, is applied to all dummy regions including dummy regions adjacent various functional blocks. Thereafter, another dummy insertion process, similar to steps 420, 430, 440 and 445 of the method 400, is applied to a subset of the functional blocks (such as functional blocks 310 and 312) to identify associated approximate regions and modify the dummy features in the associated approximate regions. Particularly, the dummy insertion process applied to each approximate region includes, but not limited to, one or more of the following actions: adding dummy features to the approximate region, eliminating some of the dummy features added at the global dummy insertion process, resizing the dummy features, and repositioning the dummy features.

In some embodiments of the present disclosure, silicon-calibrated process models, such as RC and geometry-based libraries, may be used as input components while performing and/or iteratively computing topography (e.g., timing/CMP/thermal, etc.). Furthermore, in other embodiments, the optical proximity correction (OPC) polygon dissection and electrical retargeting criteria or rules may be applied to calculate timing/RC/CMP-topographic effects iteratively for both contour and original IC design layout. Closed-loop investigations may be implemented to observe differences between traditional approaches and embodiments of the present disclosure.

Embodiments of the present disclosure may promote topographical-awareness, which means uniformity control of various portions of the IC design that are related to thickness, thermal properties, or some other related behavior that is important in VLSI manufacturing. Furthermore, embodiments of the present disclosure may be used to perform local density control around marco or circuit blocks to help promote stable electrical properties and process uniformity.

Embodiments of the present disclosure may be applied in general CMP/CAA/thermal or eDFM awareness, inspection, and optimization design flows for circuits and devices. Other embodiments of the present disclosure may be applied to ASIC, IP, or standard cell re-characterization and enhancement applications. Furthermore, embodiments of the present disclosure offer a pattern-density modulation approach to current IC design flows that are advantageous over traditional methods, systems, and apparatuses using in IC manufacturing. The embodiments described herein may facilitate an efficient and cost-effective design optimization flow with the goal of improving yield of IC manufacturing processes, and simplify current IC design flows.

The embodiments described herein are fully compatible with current deep submicron IC design flows, and may be implemented as a rule refinement tool or as an approach for traditional semiconductor manufacturing processes. In addition, the embodiments of the present disclosure may provide a higher degree of freedom during dummy polygon insertion for foundries or IDM companies with respect to IP/marco/standard cell designs.

Inline AEI measurement with feedback loop monitoring systems may be integrated into the embodiments described herein. In addition, embodiments of the present disclosure may be implemented as flow extensions with respect to baseline dummy fill skills and process flows used in traditional foundries or IDM companies.

Embodiments of the present disclosure offer functional and performance-based topographical optimization for front-end STI flatness, thermal density control, and backend CMP uniformity. Further, embodiments of the present disclosure may be used with a customized and adjustable pattern-density retargeting approach for circuit blocks or logical cells.

Figure 5:
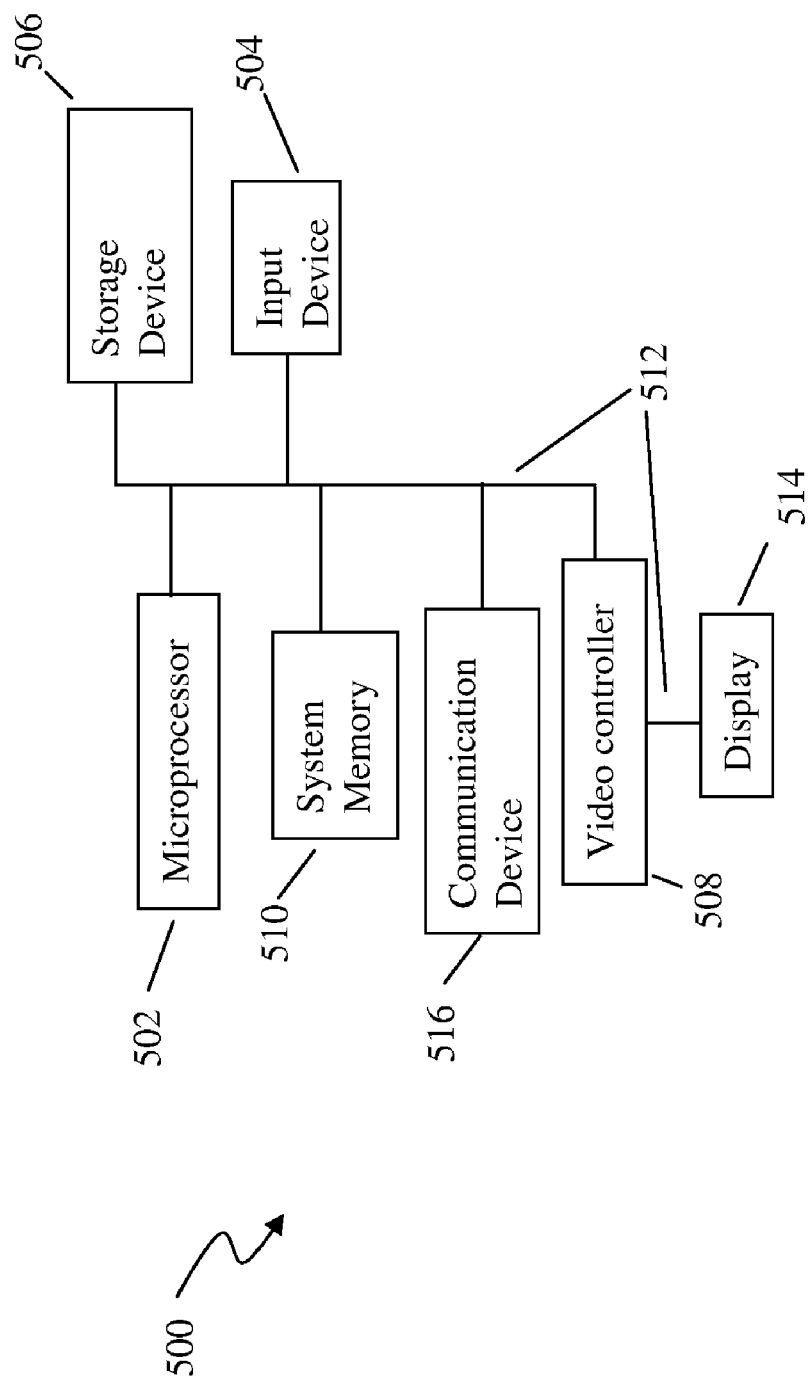
FIG. 5 is an illustration of a computer system for implementing one or more embodiments of the present invention.

Referring now to FIG. 5, shown therein is an illustrative computer system 500 for implementing embodiments of the methods described above. Computer system 500 includes a microprocessor 502, an input device 504, a storage device 506, a video controller 508, a system memory 510, a display 514, and a communication device 516 all interconnected by one or more buses 512. The storage device 506 could be a floppy drive, hard drive, CD-ROM, optical drive, or any other form of storage device. In addition, the storage device 506 may be capable of receiving a floppy disk, CD-ROM, DVD-ROM, or any other form of computer-readable medium that may contain computer-executable instructions. Further communication device 516 could be a modem, network card, or any other device to enable the computer system to communicate with other nodes. It is understood that any computer system could represent a plurality of interconnected (whether by intranet or Internet) computer systems, including without limitation, personal computers, mainframes, PDAs, and cell phones.

A computer system typically includes at least hardware capable of executing machine readable instructions, as well as the software for executing acts (typically machine-readable instructions) that produce a desired result. In addition, a computer system may include hybrids of hardware and software, as well as computer sub-systems.

Hardware generally includes at least processor-capable platforms, such as client-machines (also known as personal computers or servers), and hand-held processing devices (such as smart phones, personal digital assistants (PDAs), or personal computing devices (PCDs), for example). Further, hardware may include any physical device that is capable of storing machine-readable instructions, such as memory or other data storage devices. Other forms of hardware include hardware sub-systems, including transfer devices such as modems, modem cards, ports, and port cards, for example.

Software includes any machine code stored in any memory medium, such as RAM or ROM, and machine code stored on other devices (such as floppy disks, flash memory, or a CD ROM, for example). Software may include source or object code, for example. In addition, software encompasses any set of instructions capable of being executed in a client machine or server.

Combinations of software and hardware could also be used for providing enhanced functionality and performance for certain embodiments of the present disclosure. One example is to directly manufacture software functions into a silicon chip. Accordingly, it should be understood that combinations of hardware and software are also included within the definition of a computer system and are thus envisioned by the present disclosure as possible equivalent structures and equivalent methods.

Computer-readable mediums include passive data storage, such as a random access memory (RAM) as well as semi-permanent data storage such as a compact disk read only memory (CD-ROM). In addition, an embodiment of the present disclosure may be embodied in the RAM of a computer to transform a standard computer into a new specific computing machine.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The system may be designed to work on any specific architecture. For example, the system may be executed on a single computer, local area networks, client-server networks, wide area networks, internets, hand-held and other portable and wireless devices and networks.

A database may be any standard or proprietary database software, such as Oracle, Microsoft Access, SyBase, or DBase II, for example. The database may have fields, records, data, and other database elements that may be associated through database specific software. Additionally, data may be mapped. Mapping is the process of associating one data entry with another data entry. For example, the data contained in the location of a character file can be mapped to a field in a second table. The physical location of the database is not limiting, and the database may be distributed. For example, the database may exist remotely from the server, and run on a separate platform. Further, the database may be accessible across the Internet. Note that more than one database may be implemented.

Thus, the present disclosure provides an IC design method that includes providing a circuit design layout having a plurality of functional blocks disposed a distance away from each other; identifying a local pattern density to an approximate dummy region, on the circuit design layout, within a predefined distance to one of the functional blocks; performing a local dummy insertion to the approximate dummy region according to the local pattern density; repeating the identifying and performing to at least some other of the functional blocks; implementing a global dummy insertion to a non-local dummy region according to a global pattern density; and thereafter making a photomask according to the circuit design layout.

According to another embodiment, An integrated circuit (IC) design method includes providing a circuit design layout having a plurality of functional blocks; implementing a first dummy insertion to each of the functional blocks; implementing a second dummy insertion to the circuit design layout according to a global pattern density; identifying a local pattern density to an approximate dummy region on the circuit design layout and adjacent one of the functional blocks; implementing a third dummy insertion to the approximate dummy region according to the local pattern density; and making a photomask according to the circuit design layout.

According to yet another embodiment, an integrated circuit (IC) includes a plurality of functional blocks on a substrate, one of the functional block has a particular pattern density P1; an approximate dummy region within a predefined distance to the one of the functional blocks; and a non-local dummy region away from any of the plurality of functional blocks beyond the predefined distance, the non-local dummy region having a global pattern density P2, wherein the approximate region has a graded pattern density varying from P1 to P2. Particularly, the approximate region has a first portion adjacent the one of the functional blocks and with a first pattern density of P1, and has another portion adjacent the non-local dummy region and with a second pattern density of P2.

The present disclosure also provides an apparatus that may include at least one processor, a computer-readable medium, and a series of instructions stored on the computer-readable medium for execution by the at least one processor, wherein the series of instructions includes: instructions for providing a circuit design having a plurality of functional blocks disposed a distance away from each other; instructions for identifying a local pattern density requirement of one of the functional blocks; instructions for performing a dummy insertion to the one of the functional blocks and one or more portions that are positioned within a predefined dimension to the one of the functional blocks such that a new pattern density of the portions and the one of the functional blocks meets the local pattern density requirement; instructions for repeating the instructions for identifying a local pattern density requirement and the instructions for performing a dummy insertion to at least a subset of the functional blocks; instructions for assigning a global pattern density of the circuit design; and instructions for inserting dummy features to at least a subset of second portions that are separated from the one of the functional blocks by a distance that is greater than the predefined dimension such that a new pattern density of the circuit design meets the global pattern density requirement.

In the apparatus embodiment of the present disclosure, instructions for identifying a local pattern requirement may include instructions for calculating an average pattern density of a local area that includes the chosen one of the functional blocks and the one or more portions surrounding the chosen one of the functional blocks within the predefined dimension. Further, instructions for calculating an average pattern density of one of the functional blocks includes instructions for implementing an adjustable local pattern density approach. The instructions for adding dummy features may include instructions for at least one of resizing and repositioning the dummy features. In addition, the instructions for performing a dummy insertion may include instructions for inserting a dummy and instructions for at least one of resizing and repositioning the dummy. One of the functional blocks may include a feature, and the series of instructions may further include instructions for resizing the feature.

The present disclosure also provides an IC design system, that may include a place-and-route module configured to generate an IC design layout having a plurality of functional blocks disposed a distance away from each other, and a pattern density fixer module. The pattern density fixer module may be configured to identify a local pattern density requirement of one of the functional blocks, perform a dummy insertion to the one of the functional blocks and one or more portions that are positioned within a predefined dimension to the one of the functional blocks such that a new pattern density of the portions and the one of the functional blocks meets the local pattern density requirement; repeat the identifying and performing to at least a subset of the functional blocks; assign a global pattern density of the circuit design; and insert dummy features to at least a subset of second portions that are separated from the one of the functional blocks by a distance that is greater than the predefined dimension such that a new pattern density of the circuit design meets the global pattern density requirement.

In the IC design system, identifying a local pattern requirement may include calculating an average pattern density of a local area that includes the chosen one of the functional blocks and the one or more portions surrounding the chosen one of the functional blocks within the predefined dimension.

Furthermore, in the system embodiment, calculating an average pattern density of one of the functional blocks may include using an adjustable local pattern density approach. Adding dummy features may include resizing and repositioning the dummy features.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC) design method, comprising:
   providing a circuit design layout having a plurality of functional blocks disposed a distance away from each other;
   identifying a local pattern density to an approximate dummy region, on the circuit design layout, within a predefined distance to one of the functional blocks;
   performing a local dummy insertion to the approximate dummy region according to the local pattern density;
   repeating the identifying and performing to at least some other of the functional blocks; and
   implementing a global dummy insertion to a non-local dummy region according to a global pattern density.

2. The method of claim 1, further comprising performing another dummy insertion to the plurality of the functional blocks before the performing of the local dummy insertion and the implementing of the global dummy insertion.

3. The method of claim 1, wherein the local pattern density equals to a pattern density of the one of the functional blocks.

4. The method of claim 3, wherein the pattern density of the one of the functional blocks equals to an average pattern density of the one of the functional blocks.

5. The method of claim 1, wherein the local pattern density is determined to various semiconductor manufacturing data.

6. The method of claim 1, wherein the performing the local dummy insertion includes adding dummy features to the approximate dummy region, and at least one of resizing and repositioning the dummy features.

7. The method of claim 1, wherein the performing the local dummy insertion includes inserting dummy features in the approximate dummy region such that the approximate dummy region has a graded pattern density.

8. The method of claim 1, wherein the global pattern density equals to an average pattern density of the functional blocks.

9. The method of claim 8, wherein the global pattern density equals to a weighted average pattern density of the functional blocks according to respective areas of the functional blocks.

10. The method of claim 1, wherein the global pattern density equals to a median of pattern densities of the functional blocks.

11. The method of claim 1, wherein the predefined distance is determined based on a parameter of a chemical mechanical polishing (CMP) process to be applied to a semiconductor substrate having a pattern of the circuit design layout.

12. The method of claim 1, wherein the predefined distance ranges between about 20 micron and about 40 micron.

13. The method of claim 1, wherein the implementing a global dummy insertion includes implementing the global dummy insertion before the performing of the local dummy insertion.

14. A computer-implemented integrated circuit (IC) design method, comprising:
   providing a circuit design layout having a plurality of functional blocks;
   implementing a first dummy insertion to each of the functional blocks;
   implementing a second dummy insertion to the circuit design layout according to a global pattern density;
   identifying a local pattern density to an approximate dummy region on the circuit design layout and adjacent one of the functional blocks; and
   implementing a third dummy insertion to the approximate dummy region according to the local pattern density.

15. The method of claim 14, further comprising repeating the identifying and implementing the third dummy insertion to other approximate dummy regions associated with at least some other of the functional blocks.

16. The method of claim 14, wherein the implementing the second dummy insertion is before the implementing the third dummy insertion.

17. The method of claim 14, wherein the approximate dummy region is within a predefined distance to the one of the functional blocks, the certain distance is defined based on a chemical mechanical polishing (CMP) process.

18. The method of claim 17, wherein the predefined distance is about 20 micron.

* * * * *